United States Patent
Lee

(10) Patent No.: US 6,780,707 B2
(45) Date of Patent: Aug. 24, 2004

(54) METHOD OF FORMING SEMICONDUCTOR DEVICE HAVING CONTACT PAD ON SOURCE/DRAIN REGION IN PERIPHERAL CIRCUIT AREA

(75) Inventor: Kang-Yoon Lee, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 17 days.

(21) Appl. No.: 10/043,724

(22) Filed: Jan. 8, 2002

(65) Prior Publication Data

US 2002/0094631 A1 Jul. 18, 2002

(30) Foreign Application Priority Data

Jan. 12, 2001 (KR) .......................................... 2001-1892

(51) Int. Cl.[7] .......................................... H01L 21/8242
(52) U.S. Cl. ...................... 438/241; 438/245; 438/258; 438/259; 438/266
(58) Field of Search ................................ 438/241, 245, 438/258, 259, 266; 257/316, 326

(56) References Cited

U.S. PATENT DOCUMENTS

| | | | | |
|---|---|---|---|---|
| 5,949,110 A | * | 9/1999 | Arima | 257/368 |
| 5,981,369 A | * | 11/1999 | Yoshida et al. | 438/597 |
| 6,137,133 A | * | 10/2000 | Kauffman et al. | 257/316 |
| 6,417,534 B2 | * | 7/2002 | Nakahata et al. | 257/306 |
| 2002/0014648 A1 | * | 2/2002 | Mizutani et al. | 257/306 |

FOREIGN PATENT DOCUMENTS

KR 0168355 6/1997

* cited by examiner

Primary Examiner—Hsien Ming Lee
(74) Attorney, Agent, or Firm—Marger Johnson & McCollom, P.C.

(57) ABSTRACT

A method of forming a semiconductor device including a memory cell area having a plurality of memory cells and a peripheral circuit area for reading and writing data on the memory cells in the memory cell area of a semiconductor substrate is provided. Contact pads are formed on source/drain regions of transistors in the peripheral circuit area as well as in the memory cell area. The contact pads are concurrently formed on the source/drain regions of the transistors in the memory cell area and the peripheral circuit area. As a result, there is no step difference between the contact pads and, thus, it is easy to form metal contact plugs on the contact pads.

23 Claims, 16 Drawing Sheets

US 6,780,707 B2

METHOD OF FORMING SEMICONDUCTOR DEVICE HAVING CONTACT PAD ON SOURCE/DRAIN REGION IN PERIPHERAL CIRCUIT AREA

This application relies for priority upon Korean Patent Application No. 2001-1892, filed on Jan. 12, 2001, the contents of which are herein incorporated by reference in their entirety.

BACKGROUND OF THE INVENTION

1. Field of the Invention

The present invention relates to a method of forming a semiconductor device and, more particularly, to a method of forming a semiconductor device including a memory cell area having a plurality of memory cells and a peripheral circuit area for writing and reading data in the memory cells on a semiconductor substrate.

2. Description of the Related Art

In memory devices, a voltage must be applied to gate electrodes, source/drain regions, and bulks in order to drive transistors, basic elements of memory devices such as dynamic random access memories (DRAMs). For this reason, contacts formed on source/drain regions must have very low resistance. Otherwise, high contact resistance decreases current drivability. However, as design rules decrease with an increase in integration of DRAMs, the size of contact holes become reduced as well. As a result, contact resistance undesirably increases.

In a stack-type capacitor in DRAM devices, a decrease in the size of the chips increases the height of the capacitors that in turn increases the depth of the contact holes formed on the source/drain regions. Thus, the contact holes are not formed completely and contact resistance increases. Consequently, it is now more difficult to form interconnections.

In order to easily form contact plugs and reduce contact resistance, a method for forming contact pads or landing pads before forming metal contacts has been attempted. U.S. Pat. No. 5,949,110 discloses the structure of a DRAM where contact pads are formed in a peripheral circuit area as well as in a memory cell area. The structure and fabrication methods for forming the disclosed contact pads will be described with reference to FIG. 1.

As shown in FIG. 1, the DRAM includes n-type transistors $C_N$ and capacitors 150 in a memory cell area C and n-type transistors $P_N$ in a peripheral circuit area P. Contact pads 140, 140', 142, and 142' are formed on source/drain regions 120 and 120' of the transistors $C_N$ and $P_N$. The contact pad 140 connected to the source/drain region 120' in the memory cell area C serves as a bit line, and the contact pad 142 connected to the source/drain region 120 in the memory cell area C serves as a lower electrode of the capacitor 150. The contact pads 140' and 142' in the peripheral circuit area P are each connected to metal interconnections 170 via contact plugs 160. Contact pads 140, 140', 142, and 142' are concurrently formed in their respective regions. Specifically, the contact pad 140 in the memory cell area C and the contact pad 140' in the peripheral circuit area P, that is, first contact pads, are formed concurrently. The contact pad 142 in the memory cell area C and the contact pad 142' in the peripheral circuit area P, that is, second contact pads, are formed concurrently. The first and second contact pads are made by depositing and patterning a polysilicon layer on a semiconductor substrate. Interlayer insulating layers 141 are interposed between contact pad 140 and contact pad 142 so that they are not in contact with one another, and similarly between contact pad 140' and contact pad 142'.

The above-described method for forming the contact pads has several problems. First, when a polysilicon layer is patterned in the formation of the first and second contact pads, the source/drain regions of the transistors are damaged by etching, thereby deteriorating device characteristics. To prevent this, the contact pads are required to extend over field oxide layers. However, in this case, it is difficult to ensure the minimum line width that is required for a photolithographic process. Second, the bit line and the bit line contact pad are concurrently formed. In other words, bit lines are generally used as interconnections in a sense AMP region, and thus it is difficult to form the bit line and the bit line contact pad at the same time in the sense AMP region. Third, the heights of the first and second contact pads are different from each other, and thus subsequent planarization is difficult. Also, when contact holes are etched to form contact plugs on the contact pads, difficulties due to a step difference occur. If different conductive type transistors, i.e., an n-channel transistor and a p-channel transistor, are concurrently formed in the peripheral circuit area, there is an additional problem with the application of the method of forming contact pads disclosed in U.S. Pat. No. 5,949,110.

As described above, in memory devices such as DRAMs, the conventional method for forming contact pads on source/drain regions of transistors in a memory cell area and a peripheral circuit and to easily form contact holes has many problems to overcome.

SUMMARY OF THE INVENTION

The present invention provides a method of forming a semiconductor device where contact pads connected to source/drain regions of transistors in a memory cell area and a peripheral circuit are concurrently formed.

The present invention also provides a method of forming a semiconductor device where contact pads are formed of metal to realize low contact resistance on source/drain regions of transistors in a memory cell area and a peripheral circuit.

In addition, the present invention provides a method of forming a semiconductor device where contact pads on source/drain regions of a transistor in a peripheral circuit are formed of metal.

Accordingly, in the method, isolation layers are formed to define a memory cell area and a peripheral circuit on the semiconductor substrate and to isolate each device. A first conductive type transistor is formed in the memory cell area and a first conductive type transistor and a second conductive type transistor are formed in the peripheral circuit by forming source/drain regions and gate electrodes having sidewall spacers and first etch stopping layers on active areas in the memory cell area and the peripheral circuit. An interlayer insulating layer is formed on the transistors. Plugs are formed by patterning the interlayer insulating layers, opening the source/drain regions of the transistors in the memory cell area and the peripheral circuit, and filling the openings with a conductive material. Contact pads are concurrently formed on the source/drain regions in the memory cell area and the source/drain regions in the peripheral circuit by etching the plugs and the interlayer insulating layers and then node-separating the plugs.

According to a first embodiment, the conductive material is preferably doped polysilicon. During the formation of plugs, the interlayer insulating layer is etched to open the source/drain regions of the first conductive type transistors in the memory cell area and the peripheral circuit. First conductive type polysilicon layers are formed on the opened source/drain regions of the first conductive type transistors. The interlayer insulating layer is etched to open the source/drain regions of the second conductive type transistor in the peripheral circuit. A second conductive type polysilicon layer is formed on the opened source/drain regions of the second conductive type transistor.

According to the first embodiment of the present invention, a second etch stopping layer is formed on the transistors. The second etch stopping layer has lower etching selectivity than the interlayer insulating layer during the formation of the plugs. The second etch stopping layer is preferably a silicon nitride layer.

According to the first embodiment of the present invention, forming the contact pads comprises etching back the conductive material in the memory cell area and the peripheral circuit, and etching back the interlayer insulating layers in the memory cell area and the peripheral circuit to node-separate the plugs. The contact pads may be formed by chemical and mechanical polishing the conductive material and the interlayer insulating layers to node-separate the plugs.

According to another embodiment of the present invention, isolation layers are formed to define a memory cell area and a peripheral circuit on a semiconductor substrate and isolate each device. A first conductive type transistor in the memory cell area is formed and a first conductive type transistor and a second conductive type transistor are formed in the peripheral circuit by forming source/drain regions and gate electrodes having sidewall spacers and first etch stopping layers on active areas in the memory cell area and the peripheral circuit of the semiconductor substrate. A conductive epitaxial layer, which extends from the source/drain regions onto the isolation layers, e.g., field oxide layers, is formed on the respective source/drain regions. An interlayer insulating layer is formed on the transistors and the conductive epitaxial layer. Plugs are formed by patterning the interlayer insulating layer, opening the source/drain regions of the transistors in the memory cell area and the peripheral circuit, and filling the openings with metal. Metal contact pads are concurrently formed in the memory cell area and the peripheral circuit by etching the plugs and the interlayer insulating layer and then node-separating the plugs.

According to a second embodiment of the present invention, during the formation of the conductive epitaxial layer, the epitaxial layer is formed on the source/drain regions of the semiconductor substrate. First conductive type impurity ions are implanted by forming a photoresist pattern for opening the epitaxial layer formed on the source/drain regions of the first conductive type transistor and then using the photoresist pattern as an implantation mask. Second conductive type impurity ions are implanted by forming a photoresist pattern for opening the epitaxial layers formed on the source/drain regions of the second conductive type transistor and then using the photoresist pattern as an implantation mask. The epitaxial layers are preferably formed of silicon. Preferably, the doping concentration of the epitaxial layers is $10^{19} \sim 10^{21}$ atoms/cm$^3$.

According to the second embodiment of the present invention, node-separation is performed by etching back or chemical and mechanical polishing the metal plugs and the interlayer insulating layer. The metal plugs are preferably tungsten.

In accordance with another aspect of the present invention, first and second gate electrodes having sidewall spacers and etch stopping layers are formed on an active area in the peripheral circuit. An interlayer insulating layer is formed on the first and second gate electrodes. First and second conductive type transistors are formed by forming openings in predetermined portions of the interlayer insulating layer on the active area including the first and second gate electrodes, implanting first and second conductive type impurities into the openings, and forming source/drain regions. A metal layer is formed in the openings, and metal contact pads are formed by node-separating the metal layer.

According to a third embodiment of the present invention, the concentration of the first and second conductive type impurities is preferably $10^{19} \sim 10^{21}$ atoms/cm$^3$, respectively.

According to the third embodiment of the present invention, during the formation of the transistors, a first opening is formed by etching the interlayer insulating layer on the active area including the first gate electrode. A first conductive type source/drain region is formed on the semiconductor substrate by implanting first conductive type impurities into the first opening. A second opening is formed by etching the interlayer insulating layer on the active area including the second gate electrode. A second conductive type source/drain region is formed on the semiconductor substrate by implanting second conductive type impurities into the second opening.

According to the third embodiment of the present invention, the interlayer insulating layers on the active area including the first and second gate electrodes and on the isolation layer between the gate electrodes are opened by etching. A first conductive type source/drain region is formed by implanting first conductive type impurities into the active area including the first gate electrode in the opening. A second conductive type source/drain region is formed by implanting a second conductive impurities into the active area including the second gate electrode in the opening. The source/drain region of the first conductive type transistor is locally connected to the source/drain region of the second conductive type transistor by the metal contact pad.

BRIEF DESCRIPTION OF THE DRAWINGS

The above objects and advantages of the present invention will become more apparent by describing in detail preferred embodiments thereof with reference to the attached drawings in which.

DESCRIPTION OF THE PREFERRED EMBODIMENTS

Figure 1:
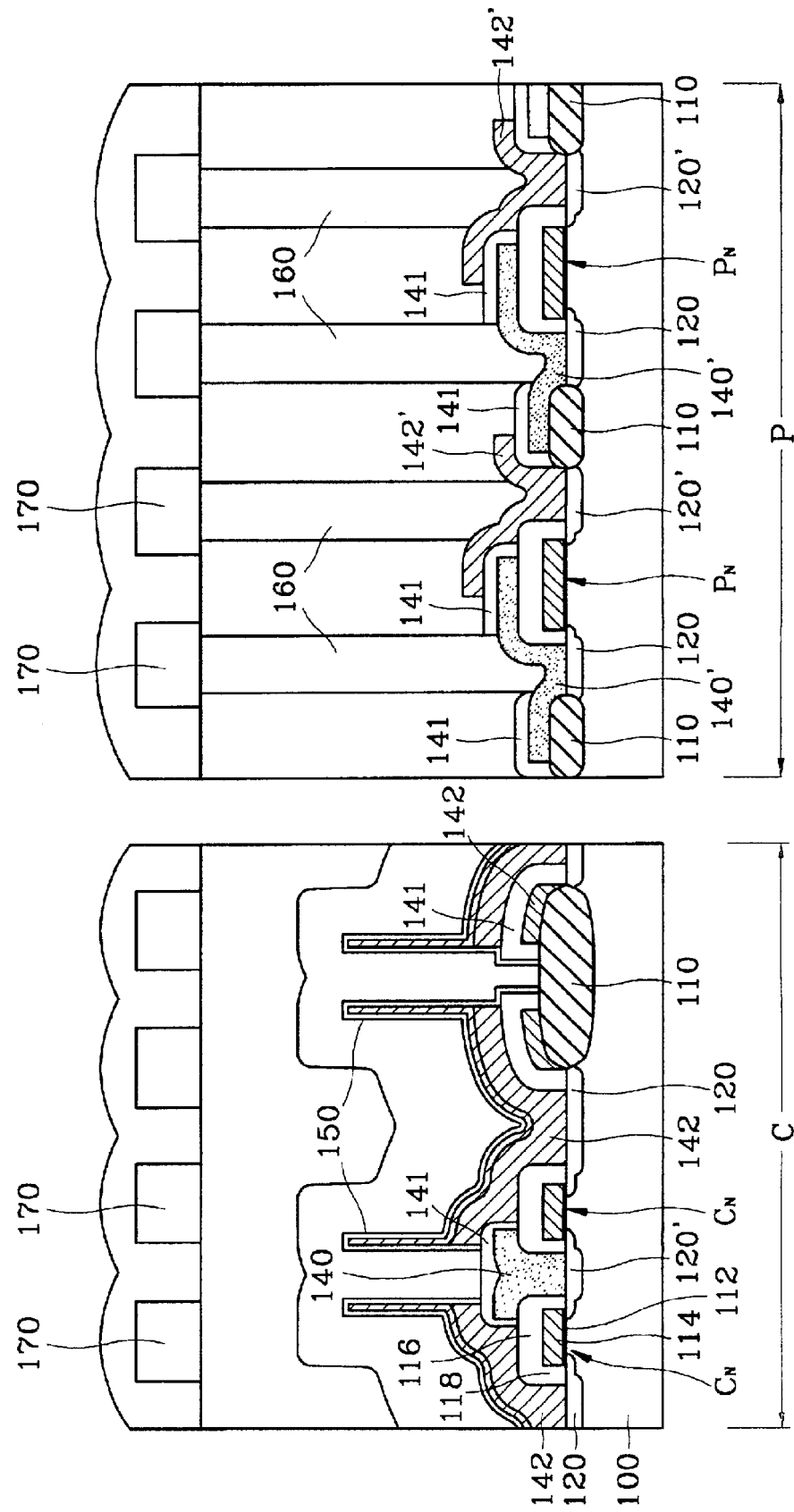
FIG. 1 is a cross-sectional view illustrating a structure having contact pads on source/drain regions of transistors in a memory cell area and a peripheral circuit according to the prior art.

Hereinafter, preferred embodiments of the present invention will be described in detail with reference to the attached drawings. However, the embodiments of the present invention can be modified into various other forms, and the scope of the present invention must not be interpreted as being restricted to the embodiments. The embodiments are provided to more completely explain the present invention to those skilled in the art. Like reference numerals in the drawings denote the same members.

Embodiment 1

Cross-sectional views describing the process of forming a DRAM having n-type transistors and capacitors in a memory cell area C and an n-channel transistor and a p-channel transistor in a peripheral circuit area P are shown in FIGS. 2 through 10 according to an embodiment of the present invention.

Figure 2:
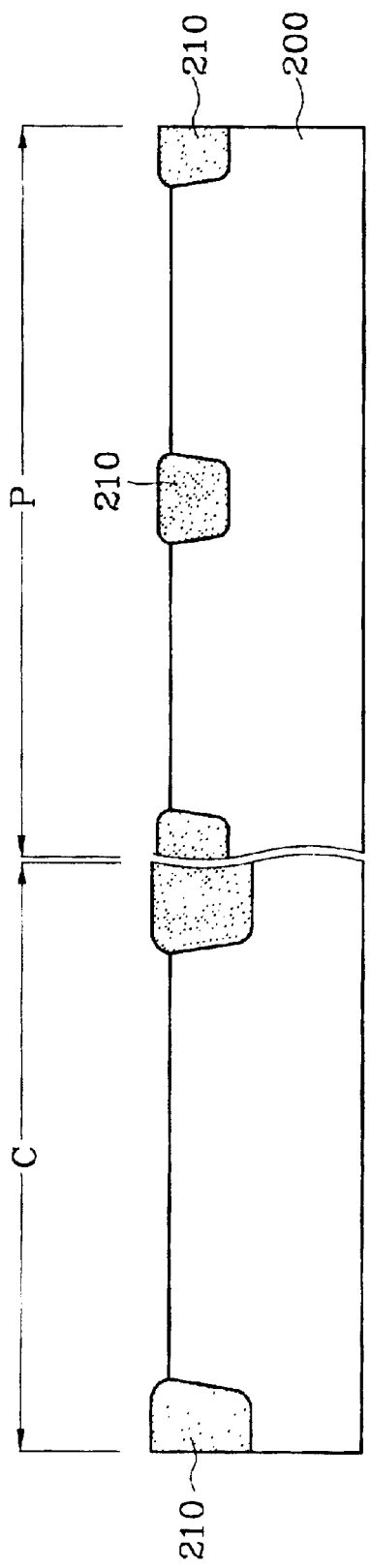
FIGS. 2 through 10 are cross-sectional views describing the steps of forming contact pads on source/drain regions of transistors in a memory cell area and a peripheral circuit according to a first embodiment of the present invention.

In FIG. 2, device isolation layers or field oxide layers 210 are formed on a p-type semiconductor substrate 200 for delimiting devices that will be formed on the p-type semiconductor substrate 200. Here, the field oxide layers 210 not only define the semiconductor substrate 200 into a memory cell area C and a peripheral circuit area P but also isolate semiconductor devices in the memory cell area C and the peripheral circuit area P. The field oxide layers 210 may be formed by a shallow trench isolation method or a local oxidation of silicon (LOCOS) process.

Figure 3:
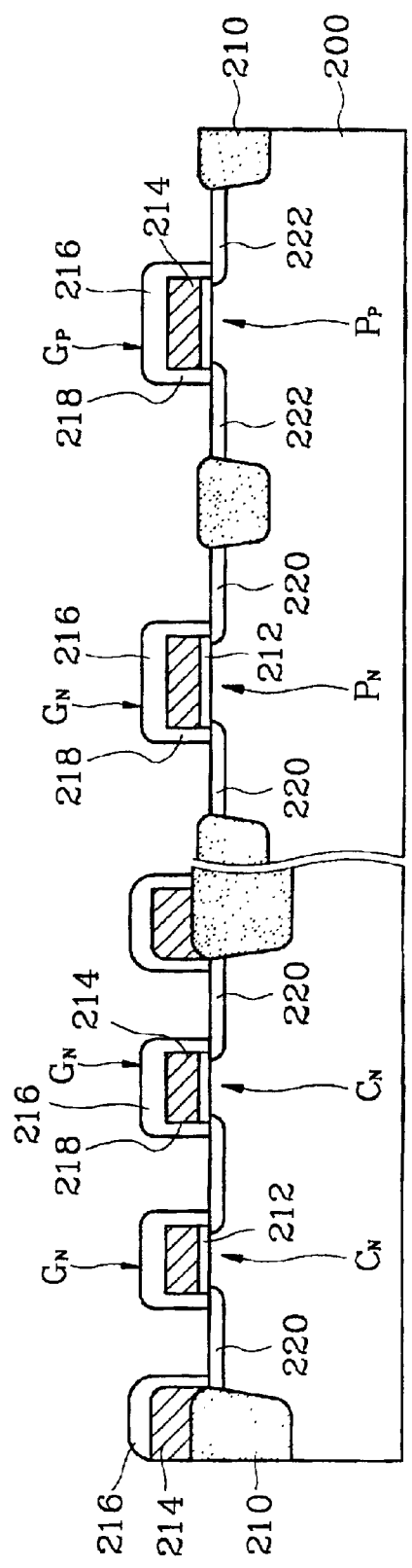

In FIG. 3, n-channel transistors $C_N$ are formed in the memory cell area C of the semiconductor substrate 200, and an n-channel transistor $P_N$ and a p-channel transistor $P_P$ are formed in the peripheral circuit area P on the semiconductor substrate 200 on which the field oxide layers 210 were formed. The transistors $C_N$, $P_N$, $P_P$ comprise gate electrodes $G_N$, $G_P$ and source/drain regions 220, 222. The gate electrodes $G_N$, $G_P$ include gate dielectric layers such as gate oxide layers 212, gate conductive layers 214, and etch stopping layers 216 all stacked in sequence, and sidewall spacers 218 adjacent the gate electrodes $G_N$, $G_P$. The fabrication methods of the gate electrodes $G_N$, $G_P$ and the source/drain regions 220 and 222 are known in the art and the detailed steps are therefore not shown in drawings. However, a brief description of the steps will be described with reference to FIG. 3.

First, a dielectric layer such as a silicon oxide layer, a conductive layer, and a silicon nitride layer are sequentially formed on the semiconductor substrate 200. The conductive layer may comprise polysilicon or polycide. The stack layers of the silicon oxide layer, the conductive layer and the silicon nitride layer may be formed by conventional techniques. The silicon oxide layer may be formed by a thermal oxidation method, and the conductive layer and the silicon nitride layer may be formed by a chemical vapor deposition (CVD) method. Here, the gate dielectric layers or the gate oxide layers 212, the gate conductive layers 214, and the etch stopping layers 216 are formed by patterning the silicon oxide layer, the conductive layer, and the silicon nitride layer, respectively. Patterns for masking portions on which the gate electrodes $G_N$, $G_P$ will be formed are formed by patterning the silicon nitride layer. Next, the conductive layer such as a polysilicon layer and the silicon oxide layer are sequentially etched using the patterns as an etching mask. The patterning process is performed by an anisotropic dry etching method, for example, a reactive ion etching (RIE) method. It is preferable that the polysilicon layers be etched with the condition that the polysilicon layer have higher etching selectivity to the silicon oxide layers so that the silicon oxide layer acts as the etch stop point. Here, the polysilicon layers having higher etching selectivity to the silicon oxide layers means that the etch rate of the polysilicon layer is faster than that of the silicon oxide layer. The term "higher etching selectivity" has the same meaning throughout the present invention.

In order to realize lightly doped drain (LDD) structures of source/drain regions 220, 222, areas of low concentration are formed by implanting ions into active areas of the semiconductor substrate using the patterned stack layers as ion implantation masks. Ion implantation is performed with n-type and p-type impurities based on the conductive type of the source/drain regions. Also, ion implantation may be performed with desired conductive impurities using a photoresist pattern that is formed by a conventional photolithographic process as an ion implantation mask.

Next, spacers 218 are formed on the sidewalls of the patterned silicon oxide layers, polysilicon layers, and silicon nitride layers by conventional techniques. For example, a silicon nitride layer for forming sidewalls is further formed on the patterned silicon oxide layers, polysilicon layers, and silicon nitride layers, and then the spacers can be formed by etching the silicon nitride layers by a RIE method. A silicon oxide layer having higher etching selectivity than the silicon nitride layer is deposited on lower portions of the silicon nitride layer. As a result, spacers can be easily formed.

Ion implantation is performed to form the source/drain regions 220 and 222 on the semiconductor substrate 200 after the spacers 218 were formed. Here, n-type impurities are implanted into the source/drain regions 220 of n-channel transistors, and p-type impurities are implanted into the source/drain regions 222 of a p-channel transistor. A photoresist pattern formed by a conventional photolithographic process is used as an ion implantation mask for performing different conductive type ion implantation processes.

Through these steps, n-channel transistors $C_N$ are formed in a memory cell area of the semiconductor substrate 200, and an n-channel transistor $P_N$ and a p-channel transistor $P_P$ are formed in a peripheral circuit area of the semiconductor substrate 200.

Hereinafter, the steps of forming the contact pads according to an embodiment of the present invention for easily forming contact plugs connected to the source/drain regions 220 and 222 of the semiconductor substrate 200, on which the transistors $C_N$, $P_N$, $P_P$ were formed, will be described with reference to FIGS. 4 through 8.

Figure 4:
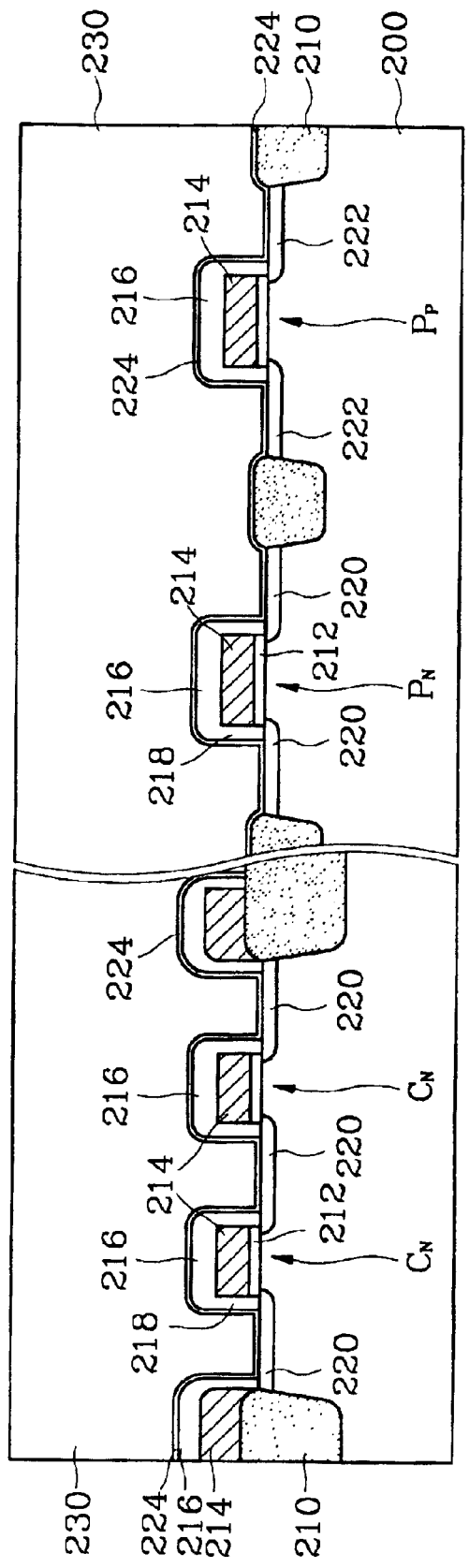

Referring to FIG. 4, silicon nitride layer 224 is formed to a thickness of about 10~20 nm on the semiconductor substrate 200, on which the cell transistors $C_N$ and the peripheral transistors $P_N$, $P_P$ is formed. The silicon nitride layer 224 serves as an etch stopping layer when openings for exposing the source/drain regions 220 and 222 are formed. The silicon nitride layer 224 may be formed by a conventional chemical vapor deposition method. Next, an interlayer insulating layer 230 is formed on the silicon nitride layer 224 by a conventional method. It is preferable that the surface of the interlayer insulating layer 230 be planarized by a chemical mechanical polishing (CMP) process to perform subsequent processes.

Figure 5:
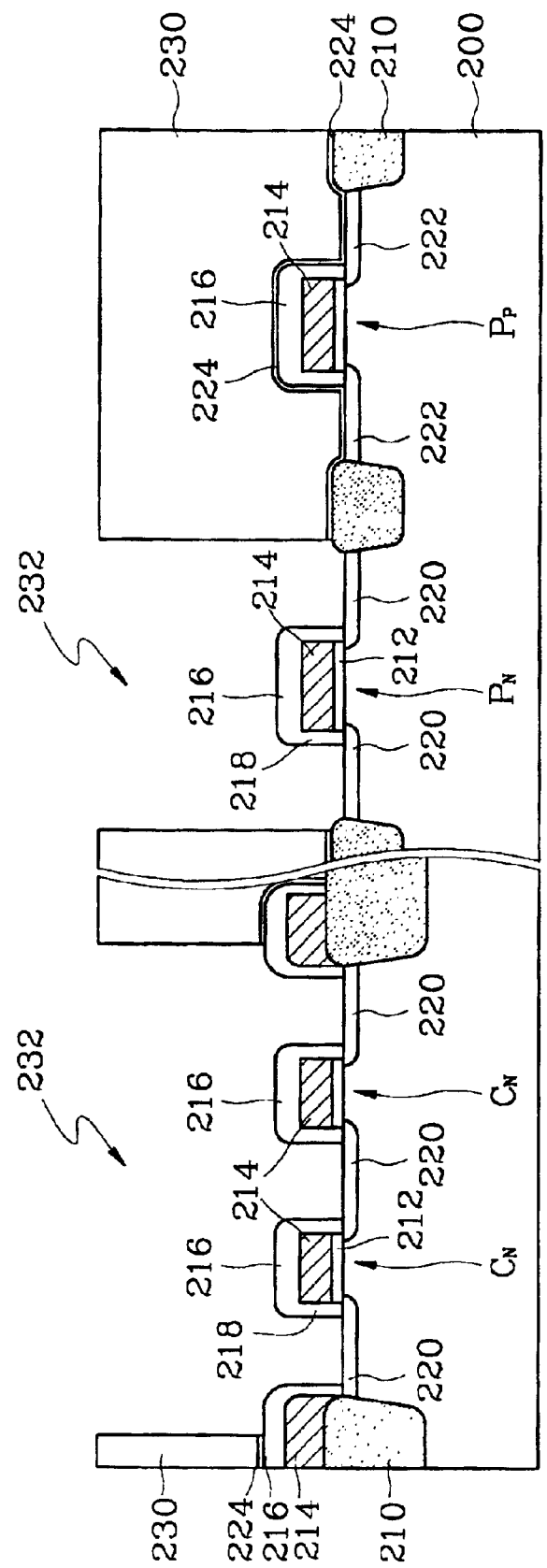

With reference to FIG. 5, active areas in the memory cell area and the peripheral circuit area in which n-channel transistors $C_N$, $P_N$ were formed are opened by etching portions of the interlayer insulating layer 230. That is, this process is performed by using photoresist patterns (not shown) for defining the openings 232 formed on the interlayer insulating layer 230 by a conventional photolithographic process. Preferably, the interlayer insulating layer 230 is etched by an anisotropic etching method, i.e., a RIE process, using the photoresist patterns as etching masks. The silicon nitride layer 224 used as an etch stopping layer is located under a lower portion of the interlayer insulating layer 230. Thus, the reactive ion etching process is preferably performed with the condition that the interlayer insulating layer have higher etching selectivity than the silicon nitride layer 224 so that the silicon nitride layer 224 can act an etch stop point. However, if the openings 232 open only the active areas of the semiconductor substrate, namely, if the boundaries of the openings are formed on the active areas, etch stopping layer does not need to exist. If the boundaries of the openings 232 are formed on the field oxide layers 210, etch stopping layer is needed to prevent the field oxide layers 210 from being etched or damaged.

The silicon nitride layer 224 that is exposed in the opening 232 and the photoresist patterns (not shown) are then removed.

Figure 6:
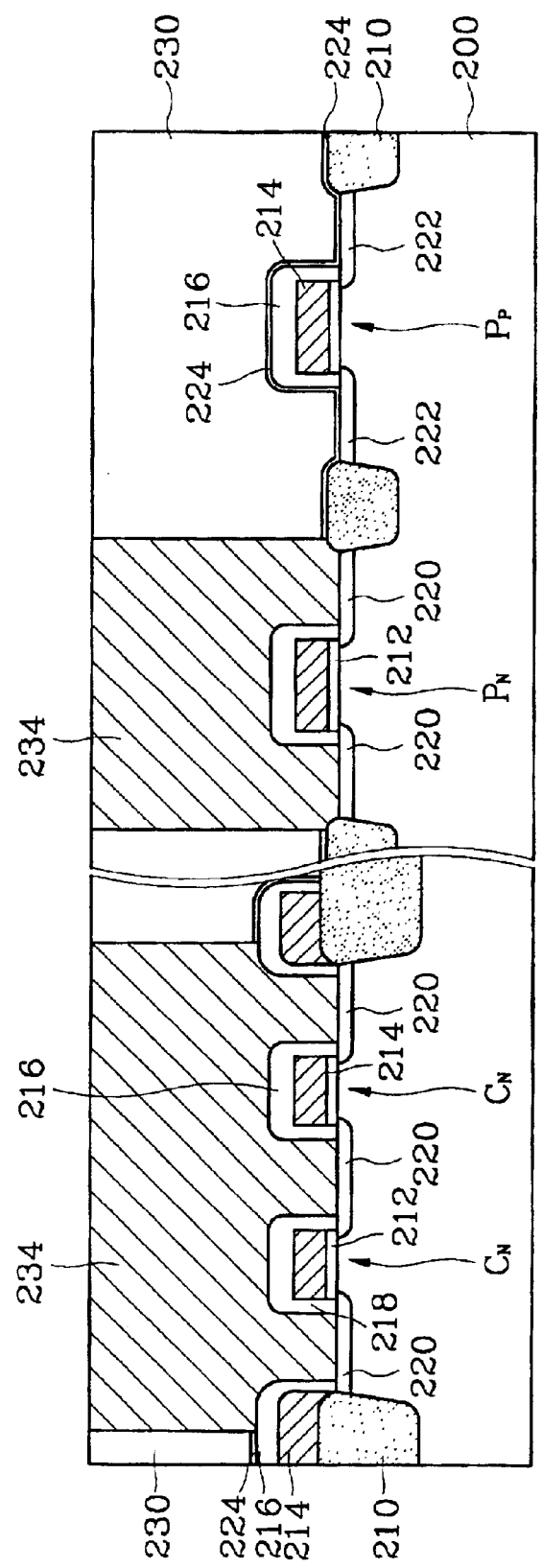

Referring to FIG. 6, the openings 232 are filled with a doped polysilicon layer 234 as explained below. The doped polysilicon layer 234 is formed on the semiconductor substrate 200, i.e., on the memory cell area and the peripheral circuit area, and then the polysilicon layer 234 formed on the interlayer insulating layer 230 is etched. Doping the polysilicon layer may be concurrent with the formation of the doped polysilicon layer 234. However, after the polysilicon layer 234 is formed, ion implantation may be performed with n-type impurity ions. The polysilicon layer 234 is planarized by conventional techniques such as an etching back or a CMP process. Here, if it is necessary, the polysilicon layer 234 may be excessively etched by the etching back method to node-separate in advance.

Figure 7:
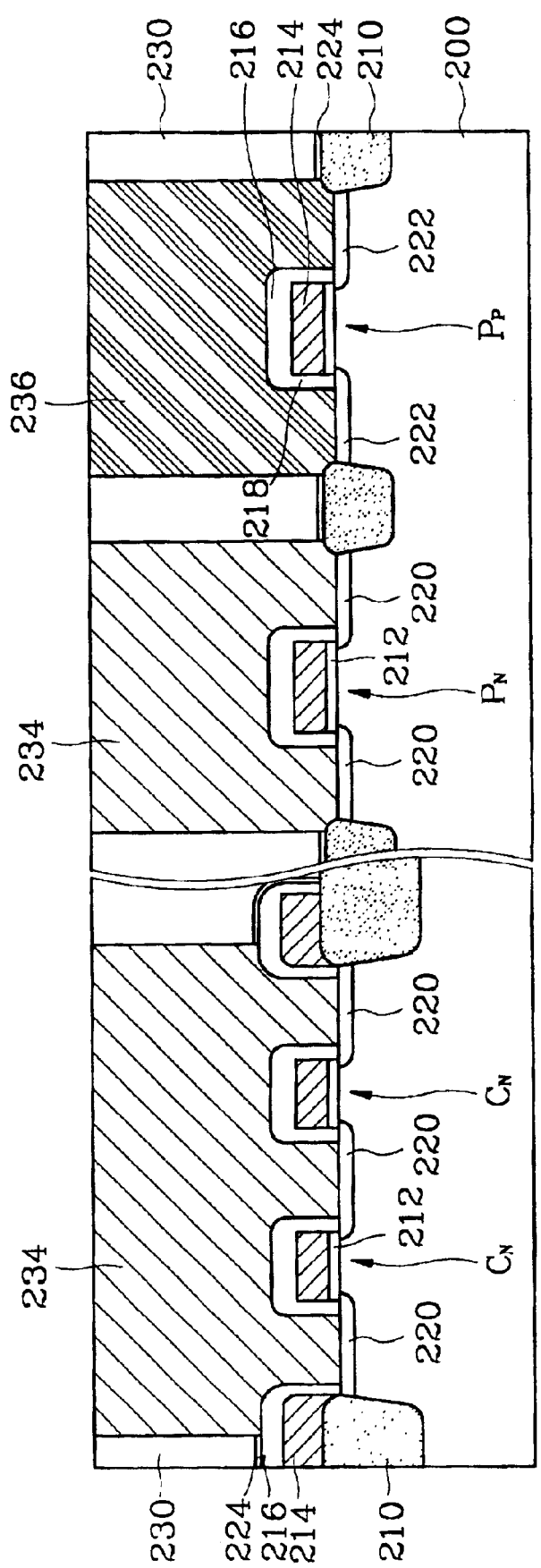

Referring to FIG. 7, an active area in the peripheral circuit area in which the p-channel transistor $P_P$ were formed is opened by etching the interlayer insulating layer 230, and the opening is filled with a doped polysilicon layer 236.

The opening is formed by the conventional photolithographic process and the etching process, as described with reference to FIG. 5. That is, a photoresist pattern (not shown) for opening the opening is formed by a photolithographic process. The interlayer insulating layer 230 is etched by a conventional dry etching process, e.g., a RIE method, using the photoresist pattern as an etching mask. Next, the silicon nitride layer 224 that is exposed in the opening and the photoresist pattern (not shown) are removed.

The polysilicon layer fills the opening in the same manner as the manner described in FIG. 6. In other words, the opening is filled by removing the photoresist pattern and forming the polysilicon layer on the semiconductor substrate by a chemical vapor deposition method. Though not shown in FIG. 7, the polysilicon layer is also formed on the n-type polysilicon layers 234 and the interlayer insulating layer 230 in the memory cell area and the peripheral circuit area. The polysilicon layer is doped with p-type impurity in-situ or through an additional ion implantation process. The ion implantation process is performed by forming a photoresist pattern (not shown) by a conventional photolithographic process to mask portions where the n-type polysilicon layer 234 is formed.

Consequently, the polysilicon layer 234 doped with n-type impurity ions and the polysilicon layer 236 doped with p-type impurity ions can be formed on the source/drain regions 220 and 222 in the memory cell area and the peripheral circuit area, respectively, as shown in FIG. 7.

Figure 8:
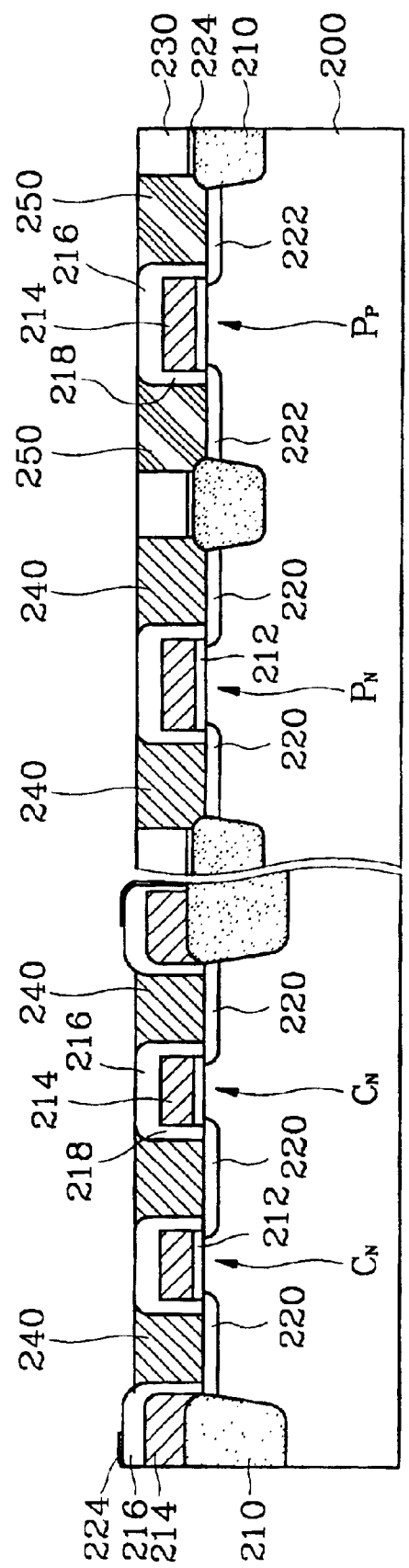

With reference to FIG. 8, the polysilicon layers 234 doped with n-type impurity ions and the polysilicon layer 236 doped with p-type impurity ions are planarized and node-separated, thereby forming contact pads 240 and 250. This is performed by conventional techniques such as an etching back process or CMP process. For example, the polysilicon layers 234 and 236 and the interlayer insulating layer 230 are node-separated by an etching back or a CMP process or a combination of both methods.

The contact pads 240 and 250 in contact with the source/drain regions of the transistors can be formed through the steps described with reference to FIGS. 4 through 8.

The formation of contact plugs 320 and 340' and storage node contact plugs 340 on the contact pads 240 and 250 according to a general DRAM process will be described with reference to FIGS. 9 and 10.

Figure 9:
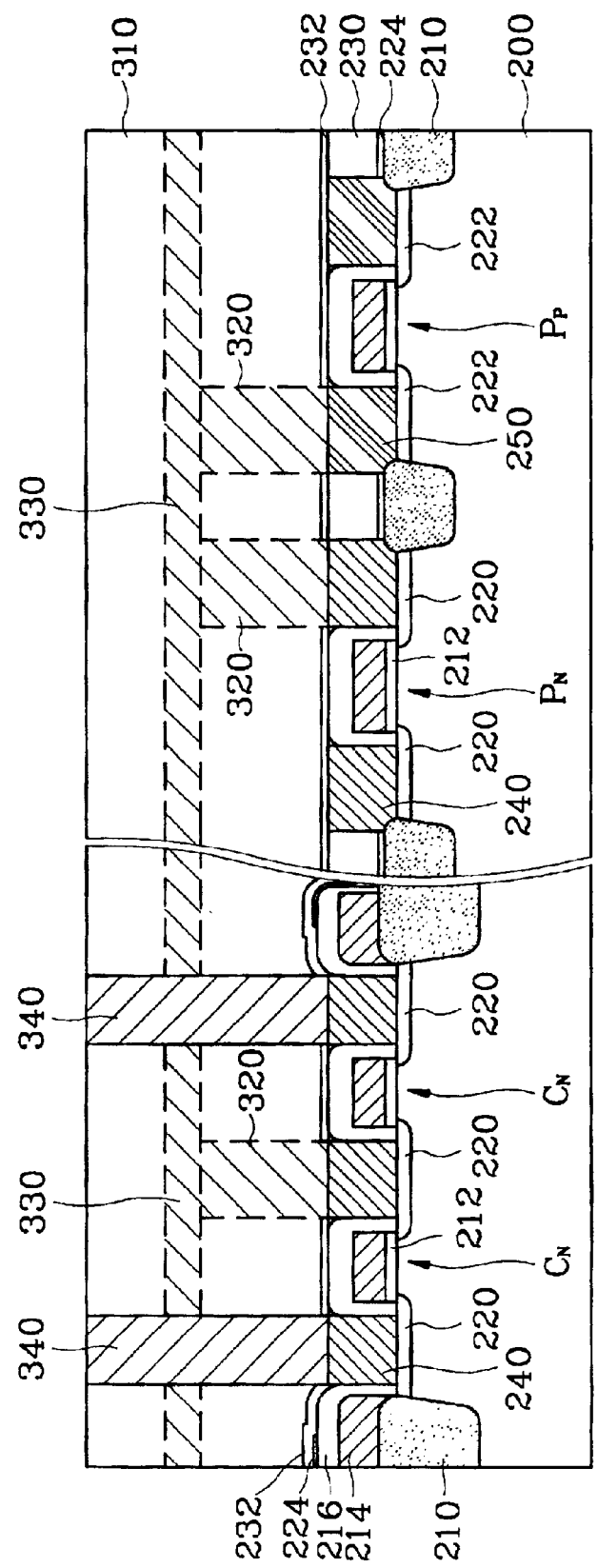

Referring to FIG. 9, bit line contact plugs 320, a bit line 330, and storage node contact plugs 340, which are connected to the polysilicon contact pads 240 and 250, are formed. That is, contact holes are formed by etching the interlayer insulating layer 310 by a conventional photolithographic process and an etching process and then the contact holes are filled with a conductive material. As a result, the bit line contact plugs 320 and the storage node contact plug 340 are formed. Here, several interlayer insulating layers that are deposited and etched during the formation of the contacts are not distinguished in the drawings. However, the interlayer insulating layer 310 can be comprised of several interlayer insulating layers depending on the formation process of the contact plugs.

The formation of the respective contact plugs will be described in detail. First, first interlayer insulating layer 310 (not distinguished) comprising silicon oxide is formed and patterned. As a result, bit line contact holes that reach the source/drain regions of the transistors are formed. Next, the bit line contact holes are filled with a conductive material, e.g., tungsten, to form the bit line contact plugs 320. The bit line 330 that is connected to the bit line contact plugs 320 is formed. If the bit line 330 is made of metal, such as tungsten W, it can be formed by deposition and patterning processes or a damascene process. If the bit line 330 is formed by a damascene process, additional interlayer insulating layers (not shown) may be formed on the first interlayer insulating layer 310. A second interlayer insulating layer (not distinguished) is formed on the bit line 330 and the first interlayer insulating layer 310. Storage node contact holes are formed in the second interlayer insulating layer by a photolithographic process and an etching process. The storage node contact plugs 340 are formed by filling storage node contact holes with a conductive material.

Here, it is noted that gate electrodes of the transistors should not be damaged when the contact holes are each formed by etching the interlayer insulating layers 310. The contact holes are formed in a narrow area between the gate lines, and thus the margin for alignment of the contact holes is narrow. Consequently, the contact holes may be misaligned and be in contact with the gate electrodes. To solve this problem, the interlayer insulating layer 310 is required to be etched with the condition that the oxide layer has higher etching selectivity than the silicon nitride layers 216 on the gate electrodes and polysilicon of the contact pads 240. As a result, the contact pads 240 or the etch stopping layer 216 on the gate electrodes naturally acts as an etch stop point so that the contact holes are not in contact with the gate electrodes.

If additional etch stopping layer 232 made of silicon nitride is formed on the contact pads 240 and 250 and the gate electrodes before the interlayer insulating layer 310 is formed, the etching of the respective contact holes stops on the etch stopping layer 232. Consequently, the contact holes can be easily formed without damaging the gate electrodes.

Figure 10:
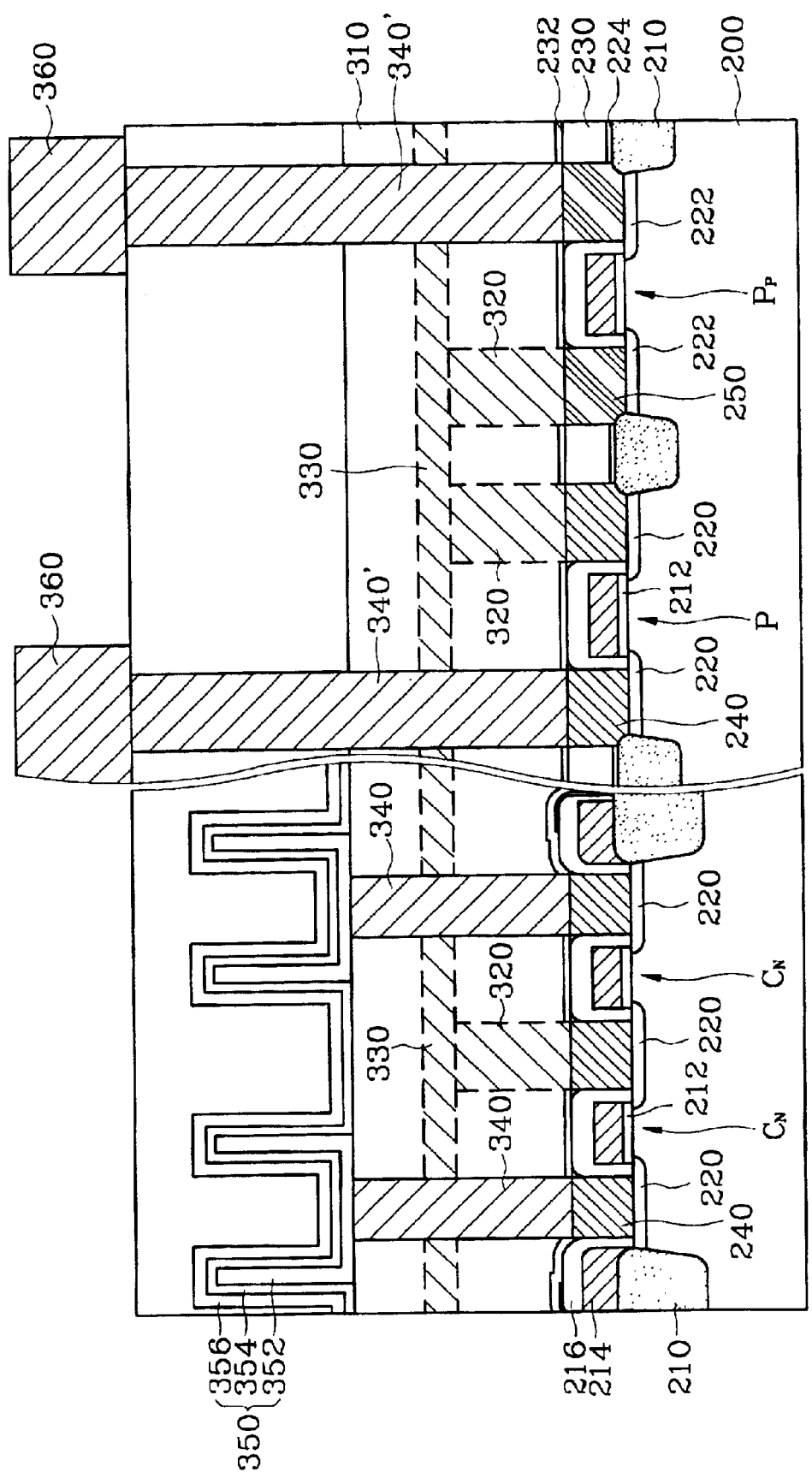

Referring to FIG. 10, capacitors 350 each including a capacitor lower electrode 352, a capacitor dielectric layer 354, and a capacitor upper electrode 356, metal contact plugs 340' and metal interconnections 360 are formed on the semiconductor substrate that has undergone the above steps. As a result, the basic structure of a DRAM having transistors $C_N$, $P_N$, $P_P$ and capacitors 350 is formed. Here, the formation of the capacitors 350, the metal contact plugs 340' and the metal interconnections 360 are known in the art and thus the detailed description of the steps is omitted.

According to the previously described embodiment of the present invention, contact pads are concurrently formed on source/drain regions of transistors in a memory cell area and a peripheral circuit area. Thus, unlike the prior art, when the contact pads are each patterned, damage to the source/drain regions can be prevented by an etching process. Also, the contact pads according to this embodiment have nearly the same height. Thus, it is easy to form metal contact plugs that are connected to the contact pads in the memory cell area and the peripheral circuit area.

Embodiment 2

The fabrication of metal contact pads as contact pads in a memory cell area and a peripheral circuit area will be described herein below.

Figure 16:
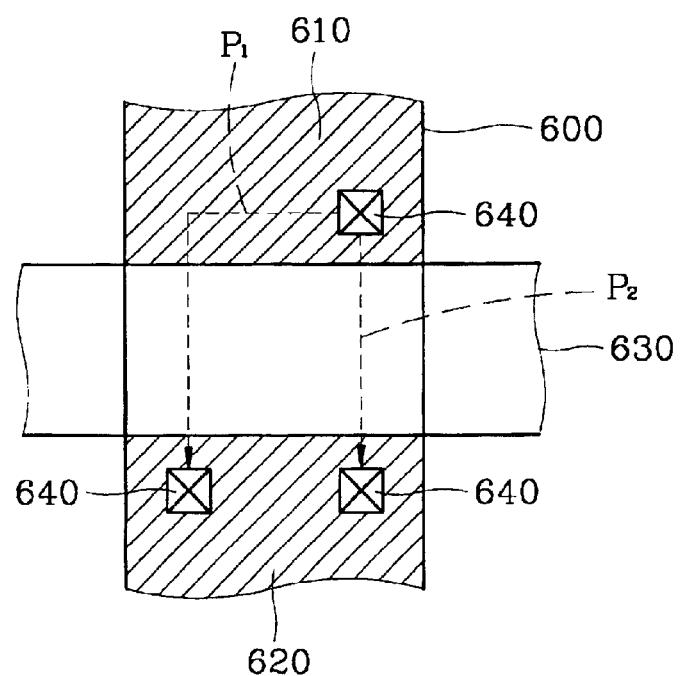
FIG. 16 is a plane view describing parasitic resistance generated on a semiconductor substrate when contacts are formed according to the prior art.

Advantages obtained by using metal contact pads are as follows. In general, highly doped polysilicon has sheet resistance of about 200 ~400 $\Omega/Q$. This is much greater than sheet resistance of a metal such as tungsten. Consequently, the contact resistance between contact pads and source/drain regions interferes with the integration of semiconductor devices. For this reason, metal contact pads are preferred to prevent the reduction of current driving power due to parasitic resistance of source/drain regions. In detail, in the plane of the semiconductor substrate shown in FIG. 16, when electric current flows from a source 610 to a drain 620, distance to contact pads 640 vary depending on paths $P_1$ and $P_2$ taken by the electric current, shown by a dotted line, through a gate electrode 630. As a result, voltage drops, and current driving power is reduced. To reduce parasitic resistance, the contact pads 640 are required to be formed on several places in the source 610 and drain 620. Thus, the active area widens, which is disadvantageous for the size of chips. In case of metal contact pads, voltage drops slightly due to resistance dependent on the current flowing distance. Thus, one contact pad 640 may be formed on a source 610 and a drain 620.

However, for ohmic contact between source/drain regions and metal contact pads, the source/drain regions must be densely doped. A method of forming source/drain regions that are densely doped will be described later.

Figure 11:
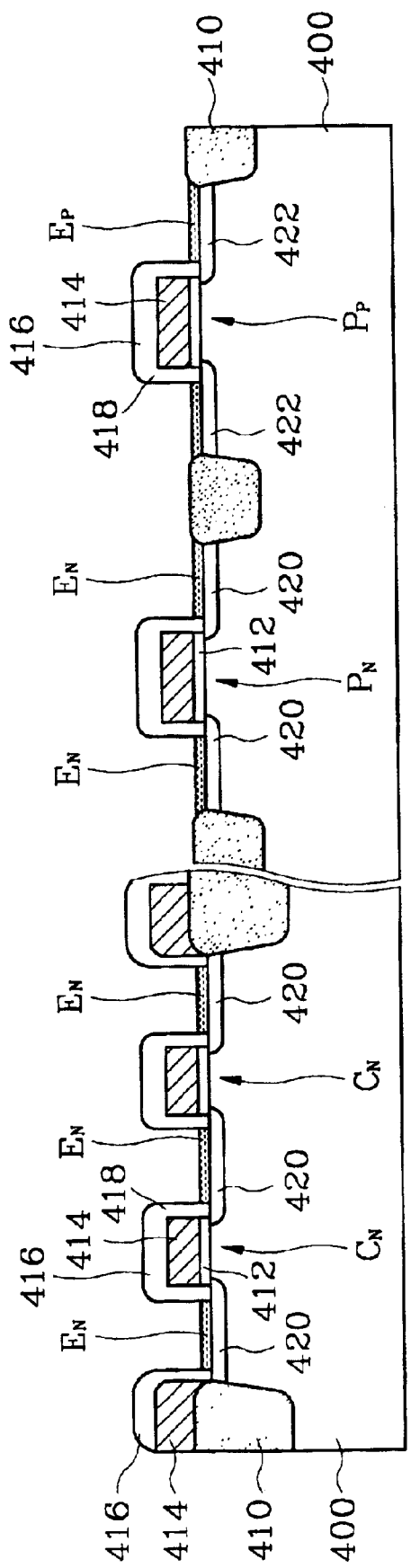
FIGS. 11 through 13 are cross-sectional views describing the steps of forming metal contact pads on source/drain regions of transistors in a memory cell area and a peripheral circuit according to a second embodiment of the present invention.
Figure 12:
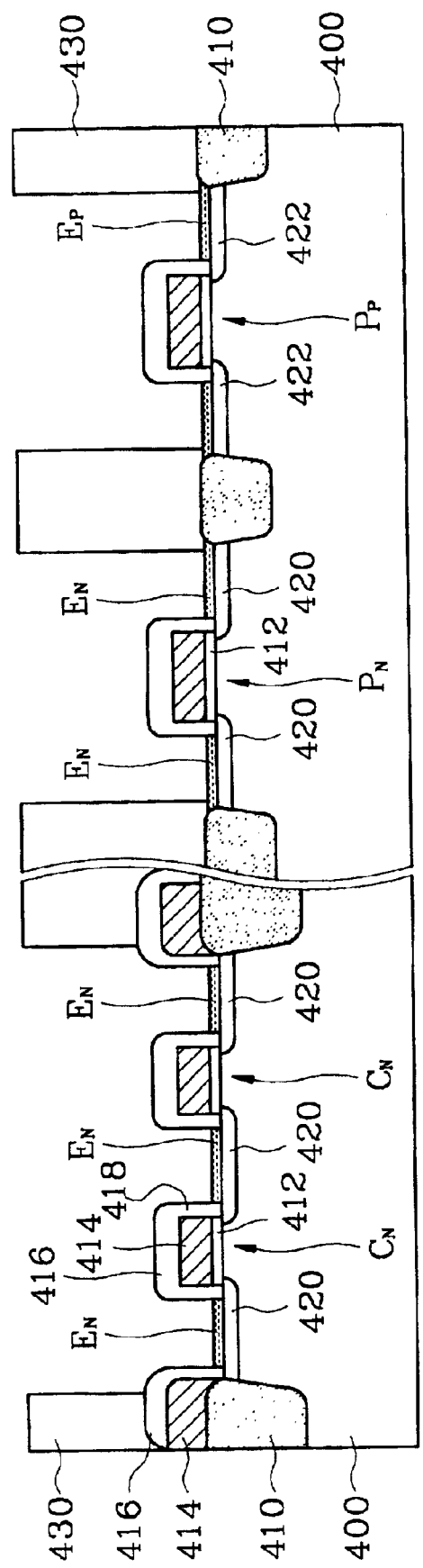
Figure 13:
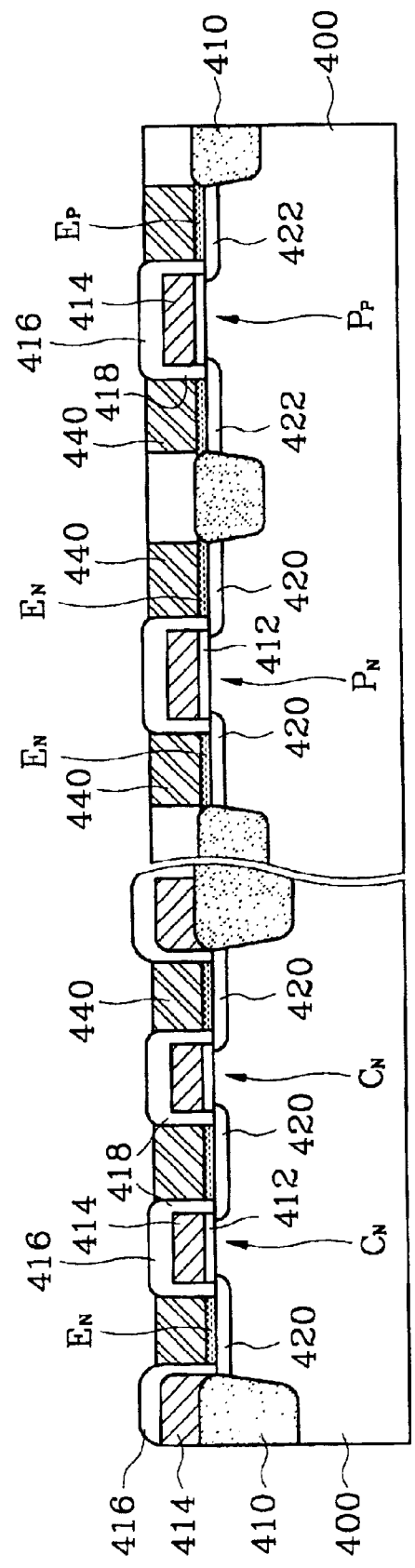

FIGS. 11 through 13 are cross-sectional views describing the fabrication of metal contact pads in accordance with an embodiment of the present invention. Referring to FIG. 11, isolation layers such as field oxide layers 410 are formed on a semiconductor substrate 400, and n-channel transistors $C_N$ and $P_N$ and a p-channel transistor $P_P$ are formed in a memory cell area and a peripheral circuit area by the same method as the embodiment described with reference to FIGS. 2 and 3. The transistors $C_N$, $P_N$, $P_P$ each include gates electrodes having etch stopping layers 416, sidewall spacers 418, and conductive layers 414 and include source/drain regions 420 and 422.

Conductive epitaxial layers $E_N$, $E_P$ are formed on the source/drain regions 420 and 422, respectively. Here, it is preferable that the epitaixal layers $E_N$, $E_P$ be overgrown somewhat onto the field oxide layers 410 that are formed around the source/drain regions 420 and 422. In general, the boundaries between the source/drain regions 420 and the field oxide layers 410 are damaged by highly dense ion implantation, which deteriorates leakage current characteristics of semiconductor devices. Thus, it is difficult to implant ions densely into the source/drain regions in the memory cell area according to the prior art. However, according to an embodiment of the present invention, the epitaxial layers EN, which extend from the source/drain regions 420 to the field oxide layers 410, protect the boundaries between the source/drain regions 420 and the field oxide layers 410 from being damaged by ion implantation. As a result, leakage current characteristics do not degrade and highly dense ion implantation is possible. The epitaixal layers $E_N$, $E_P$ can be formed by growing silicon by a known vapor epitaxy method.

A high density of impurity ions of about $10^{19}$~$10^{21}$ atoms/cm$^3$ are implanted into the deposited epitaxial layers $E_N$, $E_P$. N-type impurities are implanted into the epitaxial layers EN on the n-type source/drain regions 420, and p-type impurities are implanted into the p-type source/drain regions 422 based on the conductive type of the source/drain regions 420 and 422 underneath the epitaxial layers $E_N$, $E_P$. The implantation can be performed using a photoresist pattern (not shown) formed by a conventional photolithographic process as an ion implantation mask.

With reference to FIG. 12, openings for forming contact pads connected to the epitaxial layers $E_N$, $E_P$ are formed within an interlayer insulating layer 430 on the semiconductor substrate 400. The openings are concurrently formed within the interlayer insulating layer 430 in the memory cell area and the peripheral circuit area. The openings are formed in the same or similar manner as described above with reference to FIG. 4. More particularly, thin silicon nitride layer (not shown) is formed as an etch stopping layer on the semiconductor substrate 400 on which the epitaxial layers $E_N$, $E_P$ are formed. The interlayer insulating layer 430 is formed on the silicon nitride layer (not shown). The openings are formed therein by etching the interlayer insulating layer 430 and the silicon nitride layer (not shown) by conventional photolithographic and etching processes.

Referring to FIG. 13, metal, e.g., tungsten, is deposited on the semiconductor substrate 400 and nodes are separated using conventional techniques, thereby forming metal contact pads 440. The nodes are separated by etching the metal and the interlayer insulating layer 430 by a planarization process, such as an etching back or CMP process.

According to this embodiment, epitaxial layers, which are overgrown on the source/drain regions of transistors, are selectively formed. The epitaxial layers protect the source/drain regions underneath the epitaxial layers from being damaged by ion implantation. Thus, the source/drain regions can be densely doped with impurity ions. Metal contact pads are formed overlying the densely-doped source/drain regions.

Embodiment 3

In this embodiment, a method of forming metal contact pads in a peripheral circuit area without the epitaxial layers $E_N$, $E_P$ will be described with reference to FIGS. 14A through 14D. Contact pads in a memory cell area are formed of polysilicon like in the first embodiment. Ions are not implanted densely into source/drain regions in the memory cell area because leakage current and refresh characteristics are deteriorated, but they are implanted densely into source/drain regions in the peripheral circuit area.

Figure 14A:
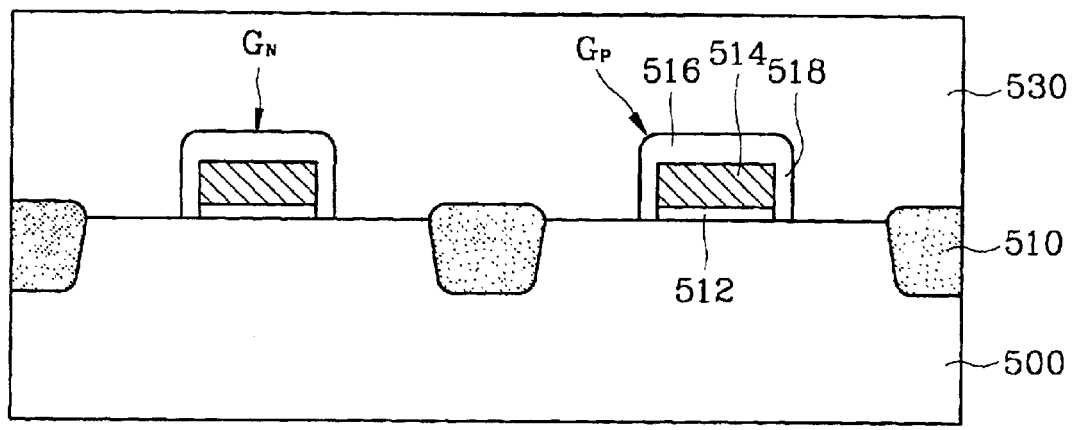
FIGS. 14A through 14D are cross-sectional views describing the steps of forming metal contact pads on source/drain regions of a transistor in a peripheral circuit according to a third embodiment of the present invention.

Referring to FIG. 14A, gate electrodes $G_N$ and $G_P$ comprising etch stopping layers 516, sidewall spacers 518, and conductive layers 514 are formed in the peripheral circuit area of a semiconductor substrate 500 by the same method as the first embodiment. However, unlike the first embodiment, ion implantation is not performed to form source/drain regions in this process.

Figure 14B:
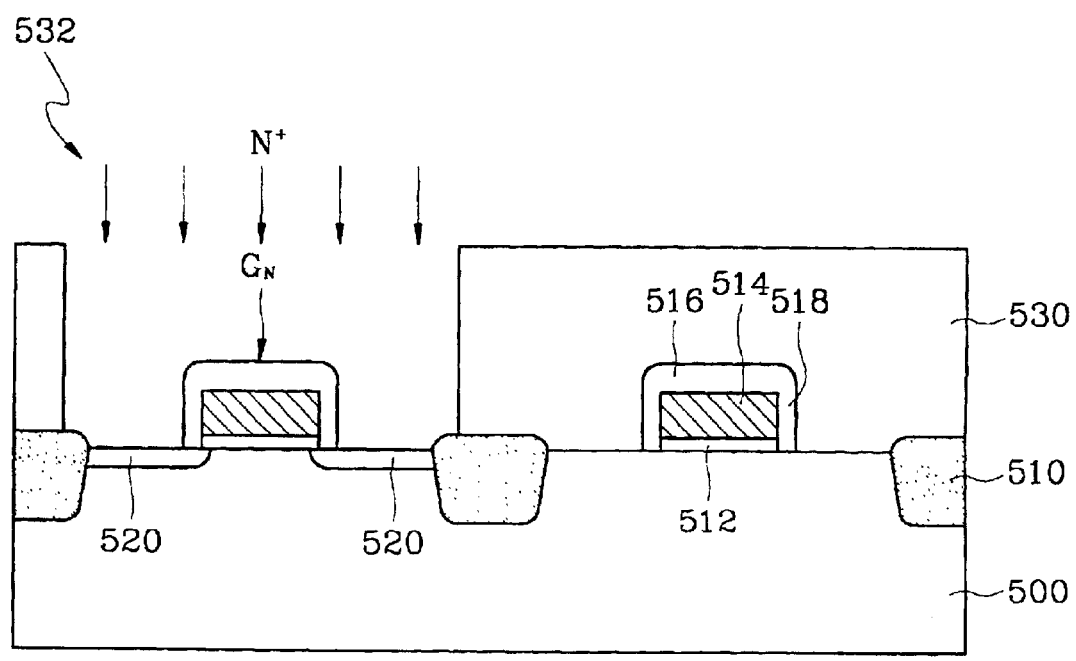

With reference to FIG. 14B, an interlayer insulating layer 530 is formed on the semiconductor substrate 500 on which the gate electrodes $G_N$ and $G_P$ are formed. An opening 532 is formed by etching a portion of the interlayer insulating layer 530 where source/drain regions of a n-channel transistor will be formed by conventional photolithographic and etching processes. The etching process is preferably performed by a RIE method. Here, the etching process may be performed by forming an additional silicon nitride layer (not shown) having higher etching selectivity than the interlayer insulating layer 530 as an etch stopping layer before the interlayer insulating layer 530 is formed. A high density of n-type impurity ions, e.g., density of about $10^{10}\sim10^{21}$ atoms/cm$^3$, are implanted into the semiconductor substrate 500. As a result, source/drain regions 520 of an n-channel transistor are formed. A portion where a p-channel transistor will be formed is protected by the interlayer insulating layer 530. Therefore, forming an additional ion implantation mask is not required.

Figure 14C:
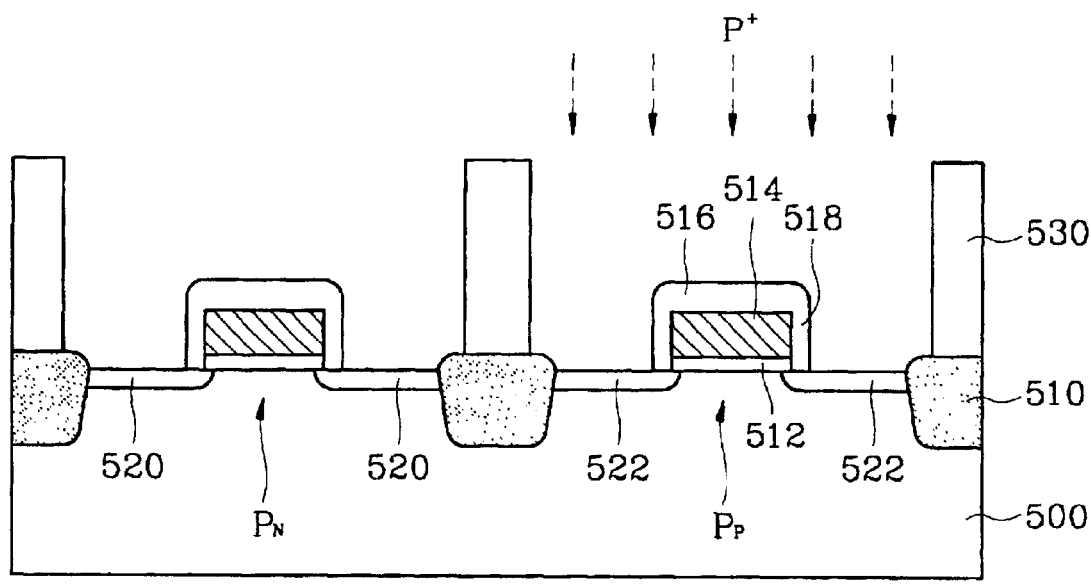

Referring to FIG. 14C, a portion of the interlayer insulating layer 530 where a p-channel transistor $P_P$ in the peripheral circuit area will be formed is opened. Source/drain regions 522 are formed by implanting p-type impurity ions into the opening. Though not shown, the opening (532 of FIG. 14B) in the n-channel transistor must be protected by an ion implantation mask, e.g., a photoresist pattern (not shown), formed by a conventional photolithographic process during the ion implantation process.

Figure 14D:
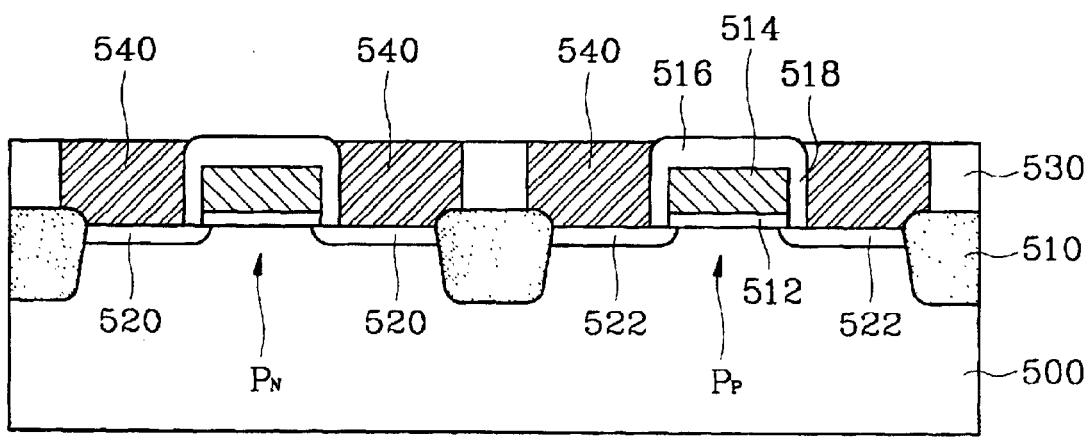

With reference to FIG. 14D, the ion implantation mask (not shown) is removed, and then metal, e.g., tungsten, is deposited in the opening and on the interlayer insulating layer 530. Metal contact pads 540 that are node-separated are formed by planarizing the metal and the interlayer insulating layer 530. Here, the planarization process may be performed by the previously described etching back or CMP process.

According to this embodiment, metal contact pads are formed on source/drain regions of n-channel and p-channel transistors in a peripheral circuit area. The process of forming the metal contact pads is much simpler than that of forming conventional metal contact pads according to the prior art. In other words, according to the prior art, a five-step photolithographic process, i.e., n-type impurity ion implantation, p-type impurity ion implantation, the formation of contact holes, n-type contact plug ion implantation, and p-type contact plug ion implantation, is performed to form the metal contact pads in the peripheral circuit area. According to this embodiment, metal contact pads are formed using a two-step photolithographic process. Thus, the number of photolithographic processes is considerably reduced, thereby reducing manufacturing costs.

Embodiment 4

Figure 15A:
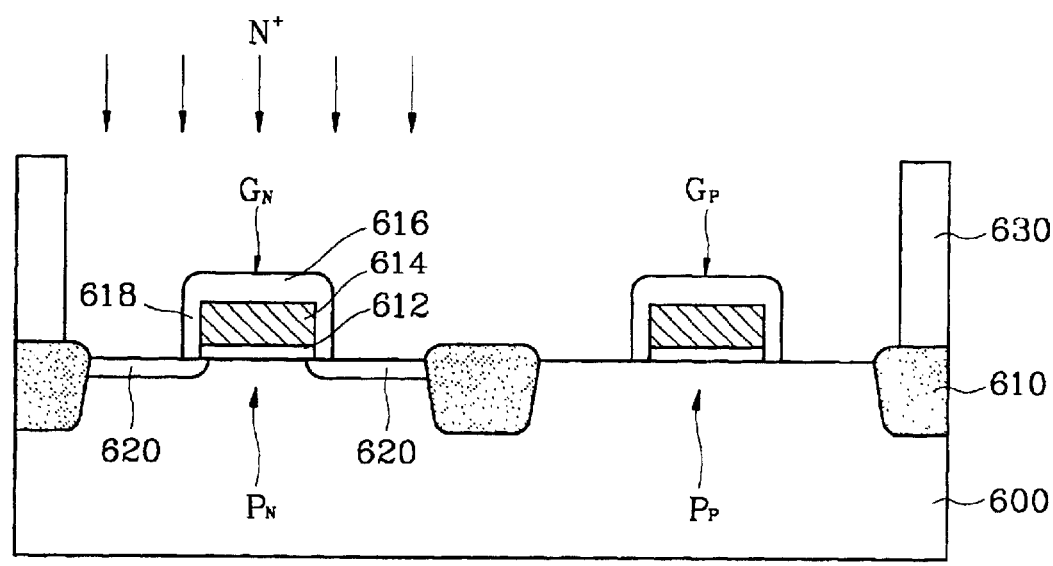
FIGS. 15A through 15C are cross-sectional views describing the steps of forming local interconnections between metal contact pads on source/drain regions of a transistor in a peripheral circuit according to a fourth embodiment of the present invention.
Figure 15B:
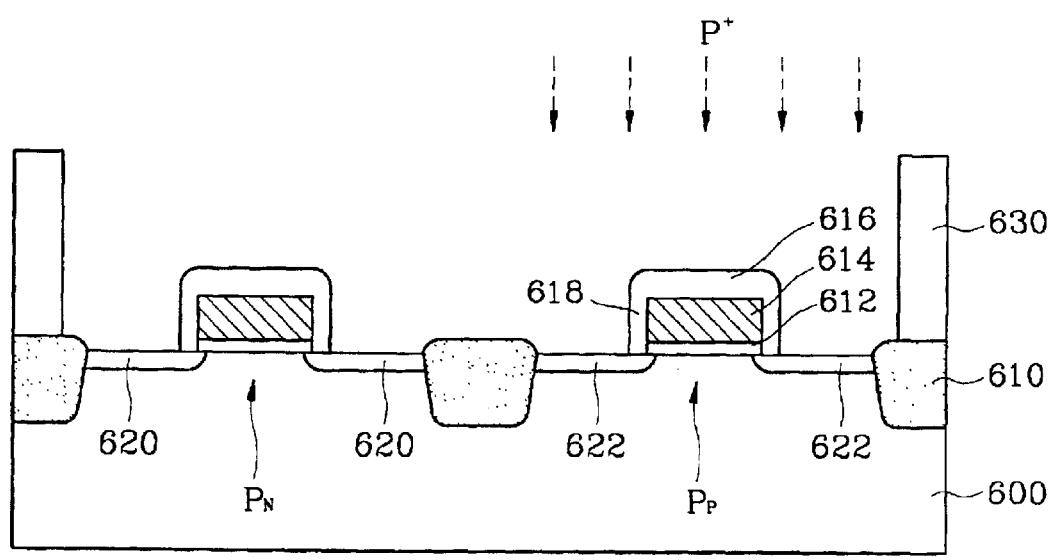
Figure 15C:
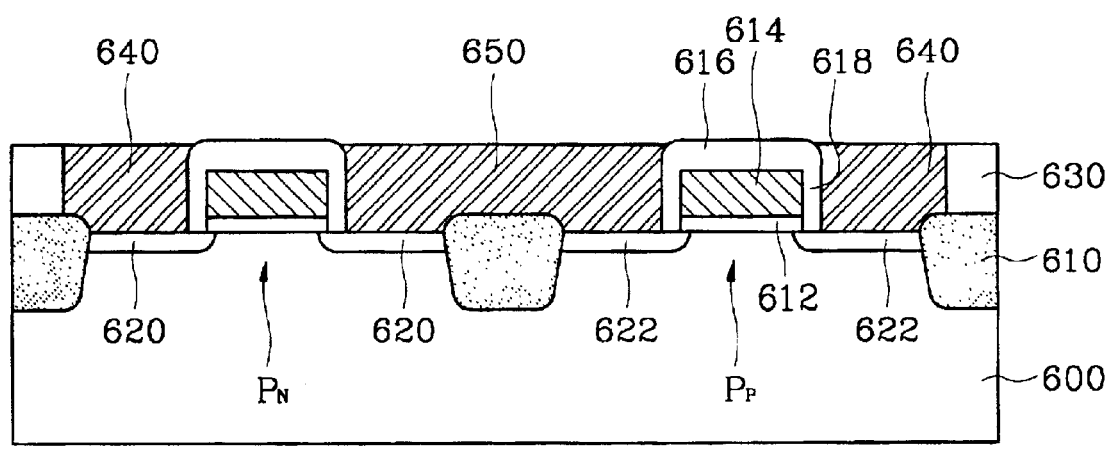

FIGS. 15A through 15C show a modified example of the third embodiment described with reference to FIGS. 14A through 14D. Here, local interconnections are formed between metal contact pads in contact with source/drain regions in a peripheral circuit area.

Referring to FIG. 15A, an opening is formed by etching a portion of an interlayer insulating layer 630 where n-channel and P-channel transistors $P_N$ and $P_P$ in the peripheral circuit area will be formed. The interlayer insulating layer 630 on a field oxide layer 610 between the transistors $P_N$ and $P_P$ is also removed. Source/drain regions 620 are formed by implanting n-type impurity ions into a portion where the n-channel transistor $P_N$ in the opening will be formed. A portion where the p-channel transistor will be formed is masked by a photoresist pattern (not shown) formed by a photolithographic process during the ion implantation process.

With reference to FIG. 15B, the photoresist pattern (not shown) is removed, and then a photoresist pattern (not shown) is formed to mask the ion-implanted portion where the n-channel transistor $P_N$ will be formed. Source/drain regions 622 are formed by implanting p-type impurity ions into the portion where the p-type channel transistor $P_P$ will be formed using the photoresist pattern as an ion implantation mask. Here, it is preferable that the concentration of the implanted n-type and p-type impurities be about $10^{19}\sim10^{21}$ atoms/cm$^3$.

Referring to FIG. 15C, the photoresist pattern (not shown) is removed. Metal, e.g., tungsten, is deposited on a semiconductor substrate 600 on which the n-channel and p-channel transistors $P_N$, $P_P$ are formed. Metal contact pads 640, 650 which are node-separated are formed by planarizing the metal and the interlayer insulating layer 630. As shown, the n-channel transistor $P_N$ is locally connected to the p-channel transistor $P_P$ by the metal contact pad 650.

According to the above-described method of forming a semiconductor device, contact pads can be concurrently formed on source/drain regions of transistors in a memory cell area and a peripheral circuit area. As a result, unlike the prior art, when the contact pads are each patterned, damage to the source/drain regions can be prevented. Also, the contact pads of the present invention have nearly the same height and thus, metal contact plugs connected to the contact pads in the memory cell area and the peripheral circuit area are easily formed.

According to a method of forming a semiconductor device having metal contact pads of the present invention, epitaxial layers that are overgrown on source/drain regions of transistors are selectively formed. The epitaxial layers protect the source/drain regions from being damaged by ion implantation. Thus, the epitaxial layers are densely doped to form metal contact pads thereon. As described in the embodiments of the present invention, the metal contact pads may be formed in the peripheral circuit area of the semiconductor device without the epitaxial layers. Also, the number of photolithographic processes used in forming the metal contact pads is less than in the prior art using polysilicon. Thus, with the present invention, manufacturing costs can be reduced.

Although the present invention has been particularly shown and described with reference to preferred embodiments thereof, the present invention is not restricted to the forgoing embodiments. It will be understood by those skilled in the art that various changes in form and details may be made to the embodiments described herein without departing from the spirit and scope of the invention as defined by the appended claims.

What is claimed is:

1. A method for forming a semiconductor device on a semiconductor substrate, the method comprising:
    (a) forming isolation layers that define a memory cell area and a peripheral circuit area on the semiconductor substrate and isolate each area;
    (b) forming a first conductive type transistor in the memory cell area and a first conductive type transistor and a second conductive type transistor in the peripheral circuit area, each transistor including source/drain regions, a gate electrode having sidewall spacers, and a first etch stopping layer;
    (c) forming an interlayer insulating layer overlying the first and second conductive type transistors;
    (d) exposing the source/drain regions of the first conductive type transistor in the memory cell area and the peripheral circuit area by etching the interlayer insulating layer;
    (e) forming first conductive type polysilicon layers on the exposed source/drain regions of the first conductive type transistors;
    (f) thereafter, exposing the source/drain regions of the second conductive type transistor in the peripheral circuit area by etching the interlayer insulating layer; and
    (g) forming second conductive type polysilicon layer on the exposed source/drain regions of the second conductive type transistor; and
    (h) concurrently forming contact pads on the source/drain regions in the memory cell area and the source/drain regions in the peripheral circuit area.

2. The method of claim 1, further comprising forming a second etch stopping layer overlying the transistors after (b).

3. The method of claim 2, wherein the second etch stopping layer has lower etching selectivity than the interlayer insulating layer in (d).

4. The method of claim 3, wherein the second etch stopping layer is a silicon nitride layer.

5. The method of claim 1, wherein (e) comprises etching back the first and second conductive type polysilicon layers in the memory cell area and the peripheral circuit area, and etching back the interlayer insulating layer in the memory cell area and the peripheral circuit area.

6. The method of claim 1, wherein in (e) comprises chemical mechanical polishing the conductive material and the interlayer insulating layer.

7. A method for forming a semiconductor device, comprising:
    (a) forming isolation layers for defining a memory cell area and a peripheral circuit area on a semiconductor substrate and isolating each area;
    (b) forming a first conductive type transistor in the memory cell area and a first conductive type transistor and a second conductive type transistor in the peripheral circuit area by forming source/drain regions and gate electrodes having sidewall spacers, and first etch stopping layers in the memory cell area and the peripheral circuit area of the semiconductor substrate;
    (c) forming conductive epitaxial layers, which extend from the source/drain regions onto the isolation layers, on the respective source/drain regions;
    (d) forming an interlayer insulating layer overlying the transistors and the conductive epitaxial layers;
    (e) forming plugs by patterning the interlayer insulating layer, and forming openings in the interlayer insulating layer to expose the source/drain regions of the transistors in the memory cell area and the peripheral circuit area, and filling the openings with metal; and
    (f) concurrently forming metal contact pads in the memory cell area and the peripheral circuit area.

8. The method of claim 7, wherein step (c) comprises:
    forming conductive epitaxial layers on the source/drain regions of the semiconductor substrate;
    implanting first conductive type impurity ions by forming a photoresist pattern for opening the conductive epitaxial layers formed on the source/drain regions of the first conductive type transistor and then using the photoresist pattern as an implantation mask; and
    implanting second conductive type impurity ions by farming a photoresist pattern for opening the conductive epitaxial layers formed on the source/drain regions of the second conductive type transistor and then using the photoresist pattern as an implantation mask.

9. The method of claim 8, wherein a doping concentration of the conductive epitaxial layers is $10^{19}$~$10^{21}$ atoms/cm$^3$.

10. The method of claim wherein the conductive epitaxial layers comprise silicon.

11. The method of claim 7, wherein the conductive epitaxial layers comprise silicon.

12. The method of claim 7, wherein node-separation in (f) is performed by etching back or chemically and mechanically polishing the plugs and the interlayer insulating layer.

13. The method of claim 7, wherein the metal in (e) is tungsten.

14. A method of forming a semiconductor device having metal contact pads on source/drain regions of transistors in a peripheral circuit area for writing and reading data in memory cells on a semiconductor substrate, the method comprising:
    (a) forming first and second gate electrodes having sidewall spacers and etch stopping layers in the peripheral circuit area;
    (b) forming an interlayer insulating layer overlying the first and second gate electrodes;
    (c) forming first and second conductive type transistors by forming an opening in portions of the interlayer insulating layer on an active area including the first and second gate electrodes, implanting first and second conductive type impurities into the opening, and forming source/drain regions;
    (d) forming a metal layer in the opening, and
    (e) forming metal contact pads by node-separating the metal layer.

15. The method of claim 14, wherein a concentration of the first and second conductive type impurities is $10^{19}$~$10^{21}$ atoms/cm$^3$.

16. The method of claim 14, wherein (c) comprises:
    forming a first opening by etching a portion of the interlayer insulating layer on the active area including the first gate electrode;
    forming a first conductive type source/drain region on the semiconductor substrate by implanting first conductive type impurities into the first opening;
    forming a second opening by etching a portion of the interlayer insulating layer on the active area including the second gate electrode; and forming a second conductive type source/drain region on the semiconductor substrate by implanting second conductive type impurities into the second opening.

17. The method of claim 14, wherein (c) comprises:

etching a portion of the interlayer insulating layer on the active areas each including the first and second gate electrodes;

forming a first conductive type source/drain region by implanting first conductive type impurities into the active area including the first gate electrode in the opening; and forming a second conductive type source/drain region by implanting second conductive impurities into the active area including the second gate electrode in the opening.

18. The method of claim 14, wherein in the opening the interlayer insulating layer on a non-active area between the first and second gate electrodes is removed so that the source/drain regions of the first conductive type transistor is locally connected to the source/drain region of the second conductive type transistor by the metal contact pads which are node-separated.

19. A method of forming a semiconductor device inducting a memory cell area having a plurality of memory cells and a peripheral circuit area for writing and reading data in the memory cell area of a semiconductor substrate, the method comprising:

(a) forming isolation layers for defining a memory cell area and a peripheral circuit area on the semiconductor substrate and isolating each area;

(b) forming a first conductive type transistor in the memory cell area and a first conductive type transistor and a second conductive type transistor in the peripheral circuit area by forming source/drain regions and gate electrodes having sidewall spacers, and first etch stopping layers in the memory cell area and the peripheral circuit area of the semiconductor substrate;

(c) forming a first insulating layer overlying the transistors;

(d) forming plugs by patterning the first insulating layer, forming openings in the first insulating layer to expose the source/drain regions of the transistors in the memory cell area and the peripheral circuit axes, and filling the openings with a conductive material;

(e) forming contact pads on the source/drain regions in the memory cell area and the source/drain regions in the peripheral circuit area, concurrently by etching the first insulating layer and the plugs and then node-separating the plugs;

(f) forming a second etch stopping layer on the contact pads;

(g) forming a second insulating layer on the contact pads with the second etch stopping layer; and (h) forming a contact plug on at least one contact pad.

20. The method of claim 19, wherein the second etch stopping layer has lower etching selectivity than the second insulating layer.

21. A method for forming a semiconductor device on a semiconductor substrate, the method comprising:

(a) forming isolation layers that define a memory cell area and a peripheral circuit area on the semiconductor substrate and isolate each area;

(b) forming a first conductive type transistor in the memory cell area and a first conductive type transistor and a second conductive type transistor in the peripheral circuit area, each transistor including source/drain regions, a gate electrode having sidewall spacers, and an etch stopping layer;

(c) forming an interlayer insulating layer overlying the first and second conductive type transistors;

(d) etching the interlayer insulating layer to expose the source/drain regions of the first conductive type transistor in the memory cell area and the peripheral circuit area by;

(e) forming first conductive type polysilicon layers on the exposed source/drain regions of the first conductive type transistors;

(f) thereafter, etching the interlayer insulating layer to expose the source/drain regions of the second conductive type transistor in the peripheral circuit area; and (g) forming a second conductive type polysilicon layer on the exposed source/drain regions of the second conductive type transistor; and (h) etching back the interlayer insulating layer to form contact pads concurrently on the source/drain regions in the memory cell area and on the source/drain regions in the peripheral circuit area.

22. The method of claim 21, further comprising forming a second etch stopping layer overlying the transistors after (b).

23. The method of claim 22, wherein the second etch stopping layer has lower etching selectivity than the interlayer insulating layer in (d).

* * * * *

UNITED STATES PATENT AND TRADEMARK OFFICE
CERTIFICATE OF CORRECTION

PATENT NO. : 6,780,707 B2
DATED : August 24, 2004
INVENTOR(S) : Lee

It is certified that error appears in the above-identified patent and that said Letters Patent is hereby corrected as shown below:

Column 7,
Line 5, "this-process" should read -- this process --.

Column 9,
Lines 14 and 18, "340' and" should read -- 340', and --.

Column 10,
Line 19, "layers EN, which" should read -- layers $E_N$, which --.
Line 31, "layers EN on" should read -- layers $E_N$ on --.

Column 13,
Line 30, "layer; and (g) forming" should read -- layer; (g) forming --.
Line 31, "forming second" should read -- forming a second --.
Line 44, "wherein (e) comprises" should read -- wherein (h) comprises --.
Line 50, "wherein in (e) comprises" should read -- wherein (h) comprises --.
Line 51, "polishing the conductive material and the" should read -- polishing the first and second conductive type polysilicon layers and the --.

Column 14,
Line 19, "by farming a" should read -- by forming a --.
Line 26, "of claim wherein" should read -- of claim 8, wherein --.
Line 32, "the plugs" should read -- the metal plugs --.
Line 51, "opening, and" should read -- opening; and --.

Column 15,
Line 15, "opening the" should read -- opening, the --.
Line 22, "device inducting a" should read -- device including a --.
Line 43, "circuit axes, and" should read -- circuit area, and --.

Signed and Sealed this

Thirty-first Day of May, 2005

JON W. DUDAS
*Director of the United States Patent and Trademark Office*